United States Patent [19]
Saito et al.

[11] Patent Number: 5,821,555
[45] Date of Patent: Oct. 13, 1998

[54] SEMICODUCTOR DEVICE HAVING A HETERO INTERFACE WITH A LOWERED BARRIER

[75] Inventors: Shinji Saito, Yokohama; Masaaki Onomura, Kawasaki; Yukie Nishikawa, Narashino; Masayuki Ishikawa, Yokohama, all of Japan; Peter James Parbrook, Sheffield, United Kingdom

[73] Assignee: Kabushiki Kaisha Toshiba, Kawasaki, Japan

[21] Appl. No.: 618,823

[22] Filed: Mar. 20, 1996

[30] Foreign Application Priority Data

Mar. 27, 1995 [JP] Japan .................................. 7-067264

[51] Int. Cl.⁶ ........................... H01L 33/00; H01L 29/26
[52] U.S. Cl. ............................. 257/13; 257/97; 257/200; 372/45; 372/46
[58] Field of Search ..................... 257/200, 13, 94, 257/96, 97; 372/45, 46

[56] References Cited

U.S. PATENT DOCUMENTS 5,404,027  4/1995  Hasse et al. ........................... 257/200
5,488,233  1/1996  Ishikawa et al. ........................ 257/96

OTHER PUBLICATIONS

"ZnMgSSe Based Laser Diodes", Journal of Crystal Growth, vol. 150, (1995) S. Itoh, et al. pp. 701–706, MBE VIII '94 Proceeding, Aug. 29–Sep. 2, 1994.

"Ti/Pt/Au Ohmic Contacts To n–Type ZnSe", Japanese Journal of Applied Physics, vol. 31 (1992) Part 2, No. 12B, T. Miyajima, et al., pp. L1743–L1745, Dec. 15, 1992.

*Primary Examiner*—Mahshid D. Saadat
*Assistant Examiner*—John Guay
*Attorney, Agent, or Firm*—Oblon, Spivak, McClelland, Maier & Neustadt, P.C.

[57] ABSTRACT

A semiconductor device includes a first semiconductor layer formed of first semiconductor, a second semiconductor layer formed on the first semiconductor layer and formed of second semiconductor of a group different from a group to which the first semiconductor belongs, and a third semiconductor layer formed between the first and second semiconductor layers, the third semiconductor layer being one of a layer formed of third semiconductor of the same group as the first semiconductor and having an impurity concentration higher than the first semiconductor layer and a layer formed of fourth semiconductor of the same group as the second semiconductor and having an impurity concentration higher than the second semiconductor layer.

4 Claims, 3 Drawing Sheets

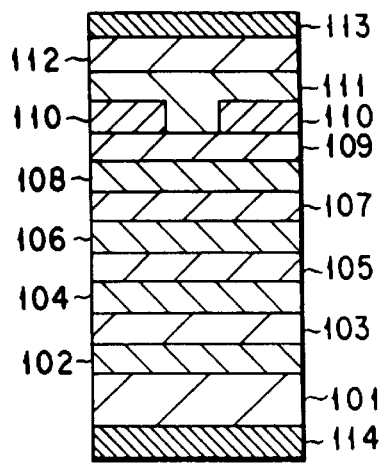
F I G. 1
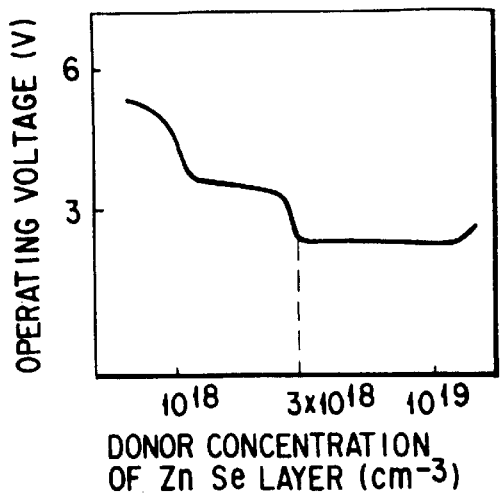
F I G. 2
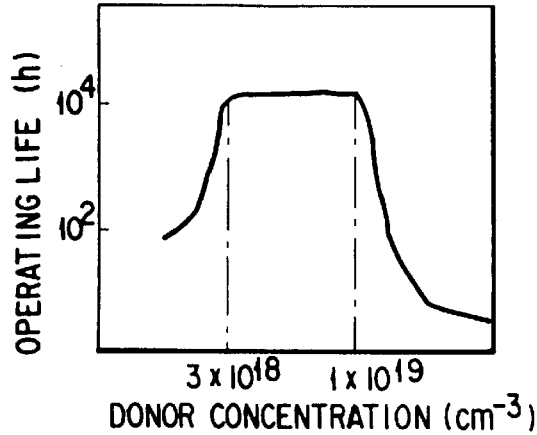
F I G. 3
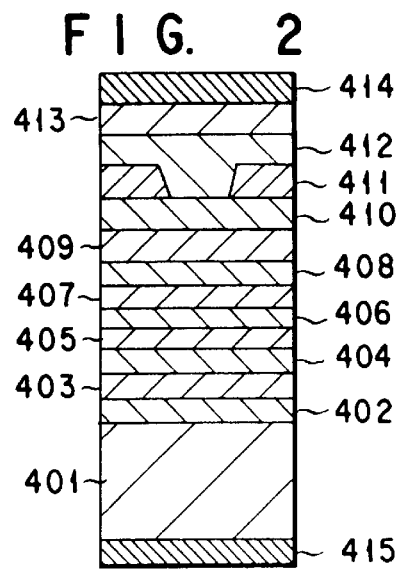
F I G. 4
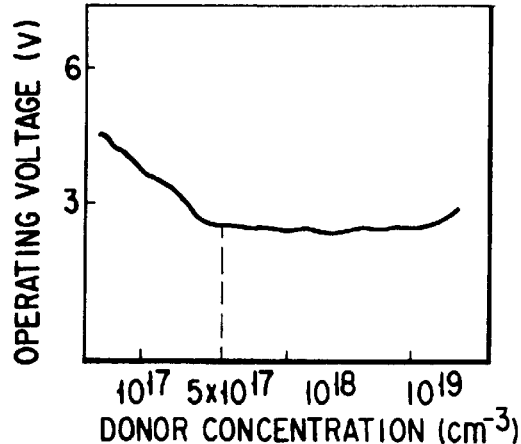
F I G. 5
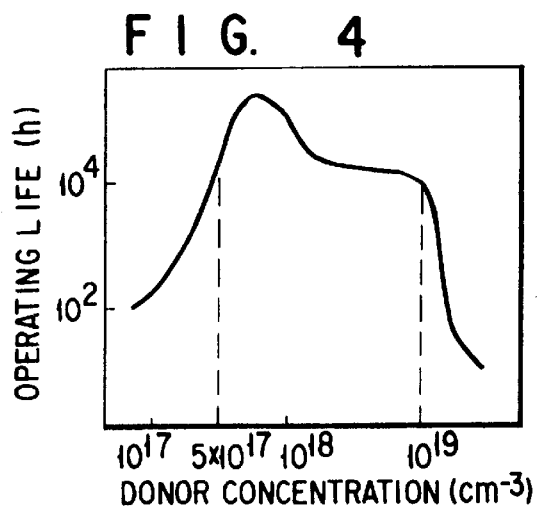
F I G. 6

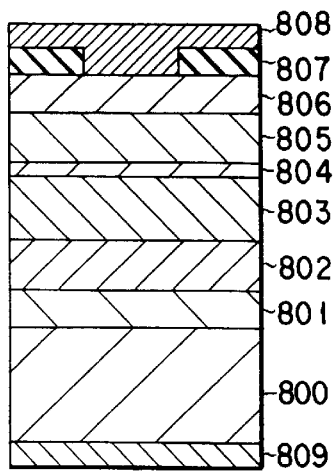
F I G. 7
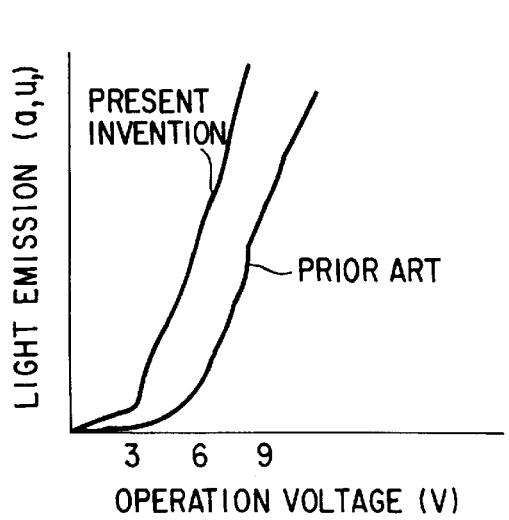
F I G. 8
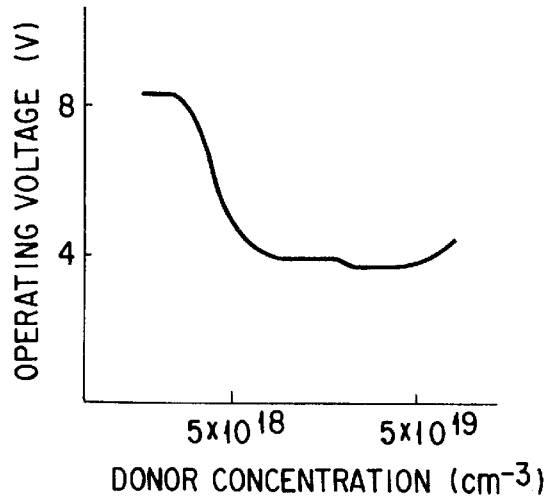
F I G. 9
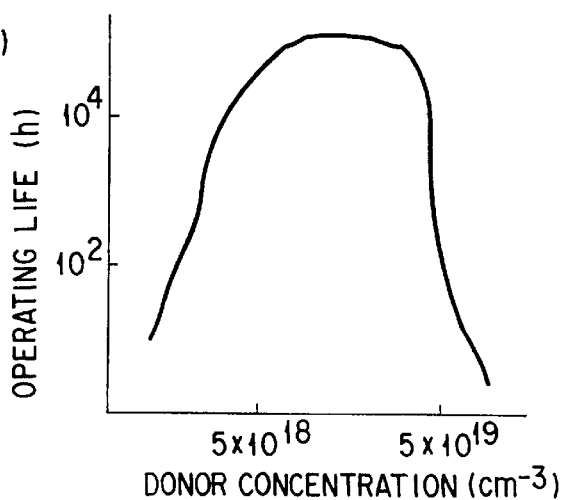
F I G. 10

SEMICONDUCTOR DEVICE HAVING A HETERO INTERFACE WITH A LOWERED BARRIER

BACKGROUND OF THE INVENTION

1. Field of the Invention

This invention relates to a semiconductor device, and more particularly to a semiconductor device having a hetero interface.

2. Description of the Related Art

A Group-II-VI compound semiconductor such as ZnSe and a nitride Group-III-V compound semiconductor such as GaN have a wide bandgap (wide gap) equivalent to or larger than an amount of energy corresponding to the wavelengths of light in the visible wavelength range and have received much attention as a visible light emitting material. Particularly, the operating wavelength range of a semiconductor laser or light emitting diode formed of a Group-III-V compound semiconductor material such as GaAlAs, InGaAlP lies in a wavelength range longer than that of green, but the semiconductor laser or light emitting diode formed by use of the wide gap Group-II-VI compound semiconductor and nitride Group-III-V compound semiconductor such as GaN may be operated in an operating wavelength range of blue or ultraviolet rays having shorter wavelengths. This makes it possible to apply the advantages of the conventional semiconductor light emitting device such as the small size, light in weight, low operating voltage, high reliability in the short wavelength region so that the density of the optical disk can be increased. Further, outdoor message boards can be displayed in full color.

In recent years, continuous oscillation of the current injection type semiconductor laser at room temperatures and high-luminance operation of the light emitting diode are reported in relation to blue-green semiconductor light emitting devices using wide gap Group-II-VI compound semiconductor such as ZnSe. For example, a current injection type blue-green semiconductor laser device using CdZnMgSeS is constructed as follows. That is, an n-type ZnMgSeS clad layer, n-type ZnSe light guide layer, CdZnSe quantum-well layer, p-type ZnSe light guide layer, p-type ZnMgSeS clad layer, p-type ZnSeS, and p-type ZnSe contact layer are sequentially stacked on one main surface of an n-type GaAs substrate. The p-type ZnSe contact layer is processed into a mesa stripe form with a width of 5 $\mu$m by chemical etching, an insulating layer is formed on the p-type ZnSeS layer outside the mesa portion and the surface thereof is made flat. A p-side electrode is formed on the flat surface. The p-side electrode is a laminated electrode of Pd/Pt/Au laminated in this order from the bottom. An n-side electrode formed of In is disposed on the other main surface of the n-type GaAs substrate.

It is reported that the blue-green semiconductor laser device with the above structure can effect the continuous oscillation at room temperatures (Room Temperature continuous operation of Blue-Green Laser Diodes, N. Nakayama et. al, Electronics Letters, Vol. 29, No. 16, pp. 1488–1489 (1993)).

In the above conventional cases, blue-green light is obtained by growing Group-II-VI compound semiconductor such as ZnSe, ZnMgSSe on the GaAs substrate by the molecular beam epitaxy (MBE).

In the nitride-series semiconductor laser containing GaN, short wavelengths shorter than 350 nm can be obtained and the oscillating operation at 400 nm is reported. The reliability that the light emitting life is longer than 10,000 hours is confirmed. Thus, nitride semiconductor is an excellent material which satisfies the necessary conditions as an optical disk recording light source for the next generation. However, even with this material, the subject of a lowering in the operating voltage remains.

A semiconductor device for effecting the low-voltage operation as a practical semiconductor laser or light emitting diode (LED) has not been realized.

In the conventional short-wavelength semiconductor light emitting device using ZnSe, it has been considered that the operating voltage is raised by the hetero barrier caused in the hetero interface of the p-type layer or the Schottky contact between the p-side electrode and the p-type semiconductor. However, it is proved as the result of study by the inventors of this application that a voltage drop in the junction between a layer having a large bandgap (for example, n-ZnSe) and a layer having a small bandgap (for example, n-GaAs) in the hetero interface of the n-type layer prevents a lowering in the operating voltage. This is considered to be because the band discontinuity in the conduction band becomes larger depending on the condition of the crystal growth and injection of electrons is prevented. It is desired to reduce the voltage drop in this portion and realize the low-voltage operation of the device by improving the obstruction to injection of electrons by the band discontinuity.

Further, a hetero barrier is present between the substrate and the GaN layer of a laser using GaN. The magnitude of the hetero barrier varies according to the condition of crystal growth, and it is proved by the study by the inventors that the hetero barrier on the conduction band side which has been considered to be low is larger than an expected value. It is necessary to reduce the voltage drop in this portion and realize the low-voltage operation of the device by improving the obstruction to injection of carriers by the band discontinuity.

SUMMARY OF THE INVENTION

An object of this invention is to provide a semiconductor device capable of attaining the practical low-voltage operation by making it easy to inject carriers in a hetero interface, particularly an n-type hetero interface by lowering the barrier in the hetero interface.

In order to solve the above problems, a semiconductor device of this invention comprises a first semiconductor layer formed of first semiconductor; a second semiconductor layer formed on the first semiconductor layer and formed of second semiconductor of a group in a periodic table different from a group in the periodic table to which the first semiconductor belongs; and a third semiconductor layer formed between the first and the second semiconductor layer, the third semiconductor layer being one of a layer formed of third semiconductor of the same group as the first semiconductor and having an impurity concentration higher than the first semiconductor layer and a layer formed of fourth semiconductor of the same group as the second semiconductor and having an impurity concentration higher than the second semiconductor layer.

In the above semiconductor device, it is preferable to make a combination of the first semiconductor layer which is formed of Group-III-V compound semiconductor and the second semiconductor layer which is formed of Group-II-VI compound semiconductor or a combination of the first semiconductor layer which is formed of one of Group-IV semiconductor and Group-IV-IV compound semiconductor and the second semiconductor layer which is formed of Group-III-V compound semiconductor.

A semiconductor device according to a first aspect of this invention comprises a first semiconductor layer formed of n-type Group-III-V compound semiconductor; a second semiconductor layer formed on the first semiconductor layer and formed of first n-type Group-II-VI compound semiconductor; and a third semiconductor layer formed of second n-type Group-II-VI compound semiconductor and formed between the first and the second semiconductor layer, the n-type impurity concentration thereof being set in a range of $3\times10^{18}$ cm$^{-3}$ to $1\times10^{19}$ cm$^{-3}$ which is higher than the impurity concentration of the second semiconductor layer.

The n-type Group-III-V compound semiconductor layer is preferably formed of one selected from a group consisting of GaAs, InP, GaP, InGaP and InGaAs.

The second n-type Group-II-VI compound semiconductor layer preferably contains at least one selected from a group consisting of Zn, Cd, Hg, O, S, Se, Te and Po.

A semiconductor device according to a second aspect of this invention comprises a first semiconductor layer formed of first n-type Group-III-V compound semiconductor; a second semiconductor layer formed on the first semiconductor layer and formed of n-type Group-II-VI compound semiconductor; and a third semiconductor layer formed of second Group-III-V compound semiconductor and formed between the first and the second semiconductor layer, the n-type impurity concentration thereof being set in a range of $5\times10^{18}$ cm$^{-3}$ to $5\times10^{19}$ cm$^{-3}$ which is higher than the impurity concentration of the first semiconductor layer.

The first n-type Group-III-V compound semiconductor layer is preferably formed of one selected from a group consisting of GaAs, InP, GaP, InGaP and InGaAs.

The second n-type Group-III-V compound semiconductor layer preferably contains at least one selected from a group consisting of In, Ga and P since favorable crystal growth can be attained at the time of growth.

A semiconductor device according to a third aspect of this invention comprises a first semiconductor layer formed of one of n-type Group-IV semiconductor and n-type Group-IV-IV compound semiconductor; a second semiconductor layer formed on the first semiconductor layer and formed of first n-type Group-III-V compound semiconductor; and a third semiconductor layer formed of second Group-III-V compound semiconductor and formed between the first and the second semiconductor layer, the n-type impurity concentration thereof being set in a range of $5\times10^{18}$ cm$^{-3}$ to $5\times10^{19}$ cm$^{-3}$ which is higher than the impurity concentration of the second semiconductor layer.

The one of n-type Group-IV semiconductor layer and the n-type Group-IV-IV compound semiconductor preferably contains at least one of Si, C and Ge.

The first and second n-type Group-III-V compound semiconductor layers preferably contain at least one of Ga, N, In and Al.

A semiconductor device according to a fourth aspect of this invention comprises a first semiconductor layer formed of one of first n-type Group-IV and first n-type Group-IV-IV compound semiconductor compound semiconductor; a second semiconductor layer formed on the first semiconductor layer and formed of n-type Group-III-V semiconductor; and a third semiconductor layer formed of one of second Group-IV semiconductor and second n-type Group-IV-IV compound semiconductor formed between the first and the second semiconductor layer, the n-type impurity concentration thereof being set in a range of $5\times10^{18}$ cm$^{-3}$ to $8\times10^{19}$ cm$^{-3}$ which is higher than the impurity concentration of the first semiconductor layer.

The first and the third semiconductor layer preferably contains at least one of Si, C and Ge.

The second semiconductor layer preferably contains at least one of Ga, N, In and Al.

In the first to fourth aspects, the third semiconductor layer can be formed of at least one atom layer.

It is proved as the result of study by the inventors of this application that, in a semiconductor device having a Group-II-VI compound semiconductor layer formed on a substrate of Group-III-V compound semiconductor, the band discontinuity in the conduction band becomes larger and injection of electrons is prevented in the junction between a layer having a large bandgap (for example, n-ZnSe) and a layer having a small bandgap (for example, n-GaAs) in the hetero interface of the n-type layer and a voltage drop in this portion prevents a lowering in the operating voltage. The obstruction to injection of electrons by the band discontinuity can be alleviated by inserting an n-type layer having a high n-type impurity concentration of $3\times10^{18}$ cm$^{-3}$ to $1\times10^{19}$ cm$^{-3}$ into a hetero interface to reduce the thickness of the depletion layer of the barrier, and thus, the operating voltage can be lowered and the operating life can be improved.

Also, in a semiconductor device having a Group-III-V compound semiconductor layer formed on a substrate of Group-IV semiconductor or Group-IV-IV compound semiconductor, the band discontinuity in the conduction band becomes larger in the junction plane to prevent the operating voltage of the device from being lowered. The obstruction to injection of electrons by the band edge discontinuity can be alleviated by inserting an n-type layer having a high n-type impurity concentration of $5\times10^{18}$ cm$^{-3}$ to $5\times10^{19}$ cm$^{-3}$ into a hetero interface to reduce the thickness of the depletion layer of the barrier, and thus, the operating voltage can be lowered and the operating life can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a cross sectional view showing the schematic structure of a semiconductor laser according to a first embodiment of this invention;

FIG. 2 is a diagram showing the relation between the operating voltage and the donor concentration of a high-impurity concentration layer in the semiconductor laser according to the first embodiment of this invention;

FIG. 3 is a diagram showing the relation between the operating life and the donor concentration of a high-impurity concentration layer in the semiconductor laser according to the first embodiment of this invention;

FIG. 4 is a cross sectional view showing the schematic structure of a semiconductor laser according to a second embodiment of this invention;

FIG. 5 is a diagram showing the relation between the operating voltage and the donor concentration of a high-impurity concentration layer in the semiconductor laser according to the second embodiment of this invention;

FIG. 6 is a diagram showing the relation between the operating life and the donor concentration of a high-impurity concentration layer in the semiconductor laser according to the second embodiment of this invention;

FIG. 7 is a cross sectional view showing the schematic structure of a semiconductor laser according to a third embodiment of this invention;

FIG. 8 is a diagram showing the relation between the operating voltage and a light output of the semiconductor laser according to the third embodiment of this invention;

FIG. 9 is a diagram showing the relation between the operating voltage and the donor concentration of a high-impurity concentration layer in the semiconductor laser according to the third embodiment of this invention;

FIG. 10 is a diagram showing the relation between the operating life and the donor concentration of a high-impurity concentration layer in the semiconductor laser according to the third embodiment of this invention;

DETAILED DESCRIPTION OF THE PREFERRED EMBODIMENTS

Figure 11:
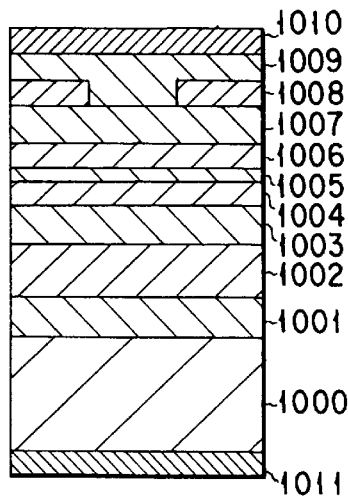
FIG. 11 is a cross sectional view showing the schematic structure of a semiconductor laser according to a fourth embodiment of this invention.

This invention will now be described in detail by explaining a method for manufacturing a blue light emitting device as an embodiment with reference to the accompanying drawings.

[First Embodiment]

FIG. 1 is a cross sectional view showing the structure of a semiconductor light emitting device (semiconductor laser) according to a first embodiment of this invention.

In FIG. 1, an n-type GaAs buffer layer 102 with a thickness of 100 nm and donor concentration of $2 \times 10^{18}$ cm$^{-3}$ and a Group-II-VI compound semiconductor buffer layer 103 formed of ZnSe, for example, with a thickness of 100 nm and donor concentration of $6 \times 10^{18}$ cm$^{-3}$ are sequentially grown on an n-type GaAs substrate 101 by the molecular beam epitaxy (MBE).

On the thus formed semiconductor substrate, a Cl (chlorine)-doped n-type MgZnSeS clad layer 104 with a thickness of 2 μm and donor concentration of $1 \times 10^{18}$ cm$^{-3}$, a Cl-doped n-type ZnSeS lower light guide layer 105 with a thickness of 100 nm and donor concentration of $1 > 10^{18}$ cm$^{-3}$, an undoped CdZnSeS single quantum-well active layer 106 with a thickness of 10 nm, an N (nitrogen)-doped p-type ZnSeS upper light guide layer 107 with a thickness of 100 nm and acceptor concentration of $1 \times 10^{18}$ cm$^{-3}$, an N-doped p-type MgZnSeS clad layer 108 with a thickness of 1 μm and acceptor concentration of $1 \times 10^{18}$ cm$^{-3}$, an N-doped p-type ZnSeS oxidation preventing layer 109 with a thickness of 10 nm and acceptor concentration of $1 \times 10^{18}$ cm$^{-3}$, and a Cl-doped n-type ZnSeS current blocking layer 110 with a thickness of 0.5 μm and donor concentration of $1 \times 10^{18}$ cm$^{-3}$ are sequentially grown at the substrate temperature of 300° C.

After the growth of each layer, the substrate temperature is rapidly lowered to the room temperature and a to-be-processed substrate is taken out from the MBE growing furnace. Even if the n-type ZnSeS layer 110 is etched in order to form a window structure for narrowing the current path, oxidation of the p-type MgZnSeS clad layer 108 due to exposure to air can be prevented by forming the n-type ZnSeS layer 110 over the p-type MgZnSeS clad layer 108 with the p-type ZnSeS layer 109 disposed therebetween.

Next, a mask formed of a photoresist or the like is formed on the n-type ZnSeS current blocking layer 110 and a current injecting opening with a width of 10 μm reaching the p-type ZnSeS oxidation preventing layer 109 is formed by the chemical etching.

After this, the mask is removed and the sulfiding process is effected, and then, an N-doped p-type ZnSeS clad layer 111 with a thickness of 2 μm and acceptor concentration of $1 \times 10^{18}$ cm$^{-3}$ is rapidly formed on a portion of the p-type ZnSeS oxidation preventing layer 109 which lies in the opening portion and the n-type ZnSeS current blocking layer 110 by MBE.

Next, a contact layer 112 whose thickness is 100 nm and whose composition is gradually changed from N-doped p-type ZnSe with acceptor concentration of $1 \times 10^{18}$ cm$^{-3}$ to N-doped p-type ZnTe with acceptor concentration of $1 \times 10^{18}$ cm$^{-3}$ is grown at the substrate temperature 300° C. Further, after the temperature is rapidly lowered to the room temperature, a p-side electrode 113 of Pt/Ti/Pt/Au is formed by the electron beam deposition method.

In the process of MBE, in order to prevent a lowering in the acceptor concentration in the exposed surface portion of the p-type ZnSeS oxidation preventing layer 109 due to annealing, the growing process is immediately started after the temperature has reached the growth starting temperature 250° C. In this case, time for the temperature to reach the growth temperature from the room temperature is three minutes and the substrate temperature in the deposition process is 150° C. or lower.

The annealing process is effected for approx. 10 seconds at a temperature of 400° C. after the electrode 113 is formed on the contact layer 112. By causing Pt to enter the p-type contact layer by the short-time annealing, the effect for increasing the contact area can be attained without lowering the acceptor concentration of the p-type contact layer. In order to prevent the concentration of the p-type contact layer from being lowered, it is necessary to adjust an amount of Pt lying between the ZnSe layer and Ti acting as barrier metal to an optimum value and it is important to control the thickness of the Pt layer which is in contact with the p-type contact layer to 10 nm or less.

Further, an n-side electrode 114 of Ti/Au is formed on the n-type GaAs substrate 101 side.

The semiconductor laser of FIG. 1 was cleaved to make a cavity length of 500 μm at surfaces parallel to the drawing and mounted on a copper heat sink by use of In solder with the p-side electrode 113 used as a welding surface, and the characteristic thereof was evaluated. As the result of evaluation, the continuous oscillation with the wavelength 520 nm, threshold current 20 mA and operating voltage 2.8 V at the room temperature was confirmed. Further, the maximum oscillation temperature of the continuous oscillation was 70° C. Further, the operation with the operating temperature 40° C. and operating light emission power 3 mW for 10,000 hours or more was confirmed.

A variation in the operating voltage in a case where the donor concentration of the $n^+$-type ZnSe buffer layer 103 is changed in the above light emitting device is shown in FIG. 2. The effect that the thickness of the depletion layer is reduced by the high-concentration doping in a donor concentration region of $3 \times 10^{18}$ cm$^{-3}$ or more is attained, the operating voltage is lowered, and particularly, the operating voltage of approx. 2.8 V which is substantially an ideal operating voltage can be attained in a donor concentration region of $5 \times 10^{18}$ cm$^{-3}$. In the concentration region lower than $3 \times 10^{18}$ cm$^{-3}$, injection of electrons is obstructed in the n-type GaAs/ZnSe interface and the operating voltage is raised. In the donor concentration region of $1 \times 10^{19}$ cm$^{-3}$ or more, the crystallinity is rapidly deteriorated and the device cannot be used as a light emitting device.

The operating life in a case where the donor concentration of the $n^+$-type ZnSe buffer layer 103 is changed as shown in FIG. 3. An operating life exceeding 10,000 hours is obtained in the donor concentration region of $3 \times 10^{18}$ cm$^{-3}$ to $1 \times 10^{19}$ cm$^{-3}$. It was proved that the device was deteriorated by heat generation caused during the operation in a donor concentration region lower than the above donor concentration region, and the crystal of the $n^+$-type ZnSe layer was already deteriorated and the defects caused a deterioration in the device at the time of operation in a donor concentration region higher than the above donor concentration region.

In view of the above fact, it is desirable to set the donor concentration of the $n^+$-type ZnSe layer in a range of $3 \times 10^{18}$ cm$^{-3}$ to $1 \times 10^{19}$ cm$^{-3}$. More preferably, it is desirable to set the donor concentration in a range of $5 \times 10^{18}$ cm$^{-3}$ to $1 \times 10^{19}$ cm$^{-3}$ from the viewpoint of the operating voltage.

In this embodiment, the ZnSe layer which can be easily formed with high concentration is used as a high donor concentration layer, but a layer containing Zn, Cd, Hg, O, S, Se, Te, Po may be used and a layer containing no Zn, Se may be used.

Further, the GaAs substrate is used as the substrate and a layer having a lattice constant nearly equal to that of the substrate is formed on the substrate, but an n-type substrate such as an InP substrate, GaP substrate, Si substrate, Ge substrate, InGaP substrate, InGaAs substrate whose conductivity type can be controlled can be used as the substrate and the high donor concentration layer grown on the substrate is not necessarily required to have lattice matching with the substrate.

Further, the high-concentration donor layer (ZnSe) may be formed with a film thickness of one atom layer or more by effecting the control at the atom size level by MBE. With such a small film thickness, the object can be fully attained.

[Second Embodiment]

FIG. 4 is a cross sectional view showing a semiconductor laser according to a second embodiment of this invention. This embodiment is obtained by additionally forming a band offset reduction layer on the substrate side of the first embodiment and improving the operating life. That is, an n-type InGaP band offset reduction layer 403 with a thickness of 100 nm and donor concentration of $5 \times 10^{18}$ cm$^{-3}$ is inserted between the n-type GaAs buffer layer 102 and the $n^+$-type ZnSe high-concentration buffer layer 103 of the structure shown in FIG. 1.

First, an n-type GaAs buffer layer 402 with a thickness of 100 nm and donor concentration of $2 \times 10^{18}$ cm$^{-3}$, the n-type InGaP band offset reduction layer 403 with a thickness of 100 nm and donor concentration of $5 \times 10^{18}$ cm$^{-3}$ and having lattice matching with the GaAs layer, and a Group-II-VI compound semiconductor buffer layer 404 formed of ZnSe, for example, with a thickness of 100 nm and donor concentration of $1 \times 10^{18}$ cm$^{-3}$ are sequentially grown on an n-type GaAs substrate 401 by the molecular beam epitaxy (MBE).

On the thus formed semiconductor substrate, a Cl (chlorine)-doped n-type MgZnSeS clad layer 405 with a thickness of 2 μm and donor concentration of $1 \times 10^{18}$ cm$^{-3}$, a Cl-doped n-type ZnSeS lower light guide layer 406 with a thickness of 100 nm and donor concentration of $1 \times 10^{18}$ cm$^{-3}$, an undoped CdZnSeS single quantum-well active layer 407 with a thickness of 10 nm, an N (nitrogen)-doped p-type ZnSeS upper light guide layer 408 with a thickness of 100 nm and acceptor concentration of $1 \times 10^{18}$ cm$^{-3}$, an N-doped p-type MgZnSeS clad layer 409 with a thickness of 1 μm and acceptor concentration of $1 \times 10^{18}$ cm$^{-3}$, an N-doped p-type ZnSeS oxidation preventing layer 410 with a thickness of 10 nm and acceptor concentration of $1 \times 10^{18}$ cm$^{-3}$, and a Cl-doped n-type ZnSeS current blocking layer 411 with a thickness of 0.5 μm and donor concentration of $1 \times 10^{18}$ cm$^{-3}$ are sequentially grown at the substrate temperature of 300° C.

The manufacturing method is the same as that for the first embodiment except that the n-type InGaP band offset reduction layer 403 is grown after formation of the GaAs buffer layer 402. A mask formed of a photoresist or the like is formed on the n-type ZnSeS current blocking layer 411 and a current injecting opening with a width of 10 μm reaching the p-type ZnSeS oxidation preventing layer 410 is formed by the chemical etching. After this, the mask is removed and the sulfiding process is effected, and then, an N-doped p-type ZnSeS clad layer 412 with a thickness of 2 μm and acceptor concentration of $1 \times 10^{18}$ cm$^{-3}$ is rapidly formed on a portion of the p-type ZnSeS oxidation preventing layer 410 which lies in the opening portion and the n-type ZnSeS current blocking layer 411 by MBE, and a contact layer 413 whose thickness is 100 nm and whose composition is gradually changed from N-doped p-type ZnSe with acceptor concentration of $1 \times 10^{18}$ cm$^{-3}$ to N-doped p-type ZnTe with acceptor concentration of $1 \times 10^{19}$ cm$^{-3}$ is grown at the substrate temperature 300° C. After this, the temperature is rapidly lowered to the room temperature and a p-side electrode 414 of Pt/Ti/Pt/Au is formed by the electron beam deposition method.

In the process of MBE, in order to prevent a lowering in the acceptor concentration in the exposed surface portion of the p-type ZnSeS oxidation preventing layer 410 due to annealing, the growing process is immediately started after the temperature has reached the growth starting temperature 250° C. In this case, time for the temperature to reach the growth temperature from the room temperature is three minutes and the substrate temperature in the deposition process is 150° C. or lower.

The annealing process is effected for approx. 10 seconds at a temperature of 400° C. after the electrode 414 is formed. By causing Pt to enter the p-type contact layer by the short-time annealing, the effect for increasing the contact area can be attained without lowering the acceptor concentration of the p-type contact layer. In order to prevent the concentration of the p-type contact layer from being lowered, it is necessary to adjust an amount of Pt lying between the ZnSe layer and Ti acting as barrier metal to an optimum value and it is important to control the thickness of the Pt layer which is in contact with the p-type contact layer to 10 nm or less.

Further, an n-side electrode 415 of Ti/Au is formed on the n-type GaAs substrate 401 side.

The semiconductor laser with the above structure was cleaved to make a cavity length of 500 μm in the same manner as in the first embodiment and mounted on a copper heat sink by use of In solder with the p-side electrode 414 used as a welding surface, and the characteristic thereof was evaluated. As the result of evaluation, the continuous oscillation with the wavelength 520 nm, threshold current 20 mA and operating voltage 2.8 V at the room temperature was confirmed. Further, the maximum oscillation temperature of the continuous oscillation was 70° C. Further, the operation with the operating temperature 40° C. and operating light emission power 3 mW for 10,000 hours or more was confirmed.

A variation in the operating voltage in a case where the donor concentration of the n$^+$-type ZnSe buffer layer is changed in the above light emitting device is shown in FIG. 5. The operating voltage of approx. 2.8 V which is substantially an ideal operating voltage can be attained in a donor concentration region of $5 \times 10^{17}$ cm$^{-3}$ to $1 \times 10^{19}$ cm$^{-3}$. In comparison with the first embodiment, in this embodiment, the concentration region which causes the operating voltage to be lowered extends to the low concentration region. If the donor concentration is lower than the above concentration region, injection of electrons is obstructed in the n-type InGaP/ZnSe interface and the voltage is raised, and if the donor concentration is lower than the above concentration region, the crystallinity of n$^+$-type ZnSe is deteriorated and the voltage is raised.

The operating life in a case where the donor concentration of the n$^+$-type ZnSe layer is changed is shown in FIG. 6. An operating life exceeding 10,000 hours is obtained in the donor concentration region of $5 \times 10^{17}$ cm$^{-3}$ to $1 \times 10^{19}$ cm$^{-3}$, and particularly, an operating life of approx. 100,000 hours is obtained in the donor concentration region near $1 \times 10^{18}$ cm$^{-3}$. It was proved that the device was deteriorated by heat generation caused during the operation in a donor concentration region lower than the above donor concentration region, and the crystal of the n$^+$-type ZnSe layer was already deteriorated and the defects caused a deterioration in the device at the time of operation in a donor concentration region higher than the above donor concentration region. In order to lengthen the operating life, it is desirable to set the donor concentration of the n$^+$-type ZnSe layer in a range of $8 \times 10^{17}$ cm$^{-3}$ to $2 \times 10^{18}$ cm$^{-3}$.

Thus, as the cause of further extension of the operating life by inserting the InGaP layer 403, the following effects can be considered in addition to the effect that the depletion layer is made thin by the presence of the InGaP layer 403 of high concentration and the operating voltage is lowered. That is, by inserting the InGaP layer having a value of bandgap between the bandgaps of the n-type GaAs layer and the n-type ZnSe layer, the step difference in the discontinuity of the conduction band edge is reduced and injection of electrons becomes easy even when the concentration of n-type ZnSe is low. If the impurity concentration of n-type ZnSe can be lowered, the crystallinity of n-type ZnSe may be improved. As a result, the number of defects in the crystal is reduced and the operating life is lengthened. Further, it was understood that growth of n-type ZnSe was more favorable on the InGaP layer than on the GaAs layer in the initial stage, and as a result, the number of defects was small in the whole n-type ZnSe layer and all of the layers formed on the n-type ZnSe layer on the InGaP layer. Thus, it was made clear from the experimental results that a deterioration occurring at the time of operation was suppressed.

In this embodiment, chlorine is used as n-type impurity, but Ga, bromine, iodine or the like which causes an n-type conductivity type may be used, and particularly, it is more preferable to use Ga when a Ga-series substrate is used when taking the degree of the matching thereof with the substrate into consideration. This is because Ga will not make the surface of a GaAs layer or InGaP layer, which is the growth surface, rough in the initial stage of a process for growing an n-type ZnSe layer unlike chlorine.

Further, in this embodiment, InGaP is used for the n-type band offset reduction layer, but InAlP, InGaAlP, ZnTeSe, CdZnSe, ZnSe/ZnTe superlattice may be used. The above materials are semiconductor materials having an intermediate value between the bandgap values of two semiconductors forming the hetero interface in which a barrier for preventing injection of electrons is present. Further, a semiconductor material having a superlattice structure and equivalently having an intermediate value between the bandgap values of the above two semiconductors may be used.

Further, in the above embodiment, the semiconductor layer having an intermediate value between the conduction band edges of two materials forming the hetero interface and having high impurity concentration is formed on the substrate side, but it is possible to form a semiconductor layer having an intermediate value of conduction band edge on the substrate side and form a buffer layer of high impurity concentration, i.e., $5 \times 10^{18}$ cm$^{-13}$ or more, on the opposite side (p-side electrode contact layer side) of the substrate with respect to the light emitting layer. Specifically, the contact layer 413 may be formed to be an N-doped p-type ZnSe layer with an acceptor concentration of $1 \times 10^{19}$ cm$^{-3}$ and thickness of 100 nm.

[Third Embodiment]

FIG. 7 is a cross sectional view of a semiconductor laser according to a third embodiment of this invention. This embodiment is an example in which a Group-III-V compound semiconductor layer is grown on a Group-IV-IV semiconductor substrate.

A reference numeral 800 denotes an n-type SiC substrate, 801 denotes an Si-doped n$^+$-type GaN layer of high impurity concentration with an impurity concentration of $8 \times 10^{18}$ cm$^{-3}$ and thickness of 1 µm, 802 denotes an Si-doped n-type GaN layer with an impurity concentration of 3 to $5 \times 10^{18}$ cm$^{-3}$ and thickness of 4 µm, 803 denotes an Si-doped n-type GaN clad layer with an impurity concentration of $5 \times 10^{17}$ cm$^{-3}$ and thickness of 0.3 µm, 804 denotes an undoped In$_{0.2}$Ga$_{0.8}$N active layer with a thickness of 0.1 µm, 805 denotes an Mg-doped p-type GaN clad layer with an impurity concentration of $5 \times 10^{17}$ cm$^{-3}$ and thickness of 0.3 µm, 806 denotes an Mg-doped p-type GaN contact layer with an impurity concentration of 1 to $3 \times 10^{18}$ cm$^{-3}$ and thickness of 0.1 µm, 808 denotes a p-side electrode, and 809 denotes an n-side electrode.

The crystal growth for the layers 801 to 806 is effected by the CVD method. After this, an SiO$_2$ mask 807 is formed on the contact layer 806 and a stripe-form opening is formed by etching, for example. Next, the p-side electrode 808 is formed on the entire upper surface and is connected to the contact layer 806 via the opening. The crystal growth method may be effected by the MBE as in the first embodiment. If the MBE is used, a film thickness of a level of one atom layer can be attained.

The semiconductor laser with the above structure was separated from the wafer by cleaving and then mounted on a copper heat sink by use of In solder with the p-side electrode 808 used as a welding surface, and the characteristic thereof was evaluated. As the result of evaluation, the continuous oscillation with the threshold current 30 mA occurred at the room temperature. The oscillation wavelength was 420 nm and the operating voltage was 4 V. The relation between the operating voltage and the light emission power is shown in FIG. 8 in comparison with that of the prior art case. In the conventional device, the operating voltage is 8 V, but in this invention, the operating voltage is greatly improved and is set to 4 V. Further, heat generation due to a resistive component does not occur, and as a result, the light emission efficiency is improved and becomes twice that of the prior art case or more.

In the above light emitting device, a variation in the operating voltage in a case where the donor concentration of the n$^+$-type GaN layer 801 of high concentration is changed is shown in FIG. 9. In a donor concentration region of $5 \times 10^{18}$ cm$^{-3}$ or more, the effect that a reduction in the thickness of the depletion layer due to high concentration doping can be attained appears and the operating voltage is lowered and substantially an ideal operating voltage of approx. 0.4 V can be attained. In a donor concentration region lower than $5\times10^{18}$ cm$^{-3}$, injection of electrons is obstructed in the n-type SiC/GaN interface and the operating voltage is raised. In a donor concentration region of $5\times10^{19}$ cm$^{-3}$ or more, the crystallinity is rapidly deteriorated and the device cannot be used as a light emitting device.

FIG. 10 shows the operating life when the donor concentration of the n$^+$-type GaN layer 801 of high concentration is changed. An operating life exceeding 10,000 hours is obtained in a donor concentration region of $5\times10^{18}$ cm$^{-3}$ to $5\times10^{19}$ cm$^{-3}$. In a region lower than the above donor concentration region, the device is deteriorated by heat generation at the time of operation, and in a region higher than the above donor concentration region, the crystal of the n$^+$-type GaN layer is already deteriorated at the time of growth and the defects cause the deterioration of the device at the time of operation.

From the above fact, it is desirable to set the donor concentration of the n$^+$-type GaN layer in a range of $5\times10^{18}$ cm$^{-3}$ to $5\times10^{19}$ cm$^{-3}$. More preferably, it is desirable to set the donor concentration in a range of $8\times10^{18}$ cm$^{-3}$ to $5\times10^{19}$ cm$^{-3}$ from the viewpoint of operating voltage.

[Fourth Embodiment]

FIG. 11 is a cross sectional view showing the schematic structure of a blue semiconductor laser according to a fourth embodiment of this invention. This embodiment is also an example in which a Group-III-V layer is grown on a Group-IV-IV layer.

An n$^+$-type SiC buffer layer 1001 of high impurity concentration with an impurity concentration of $8\times10^{18}$ cm$^{-3}$ and thickness of 1 μm, an Si-doped n-type GaN buffer layer 1002 with an impurity concentration of $1\times10^{19}$ cm$^{-3}$ and thickness of 4 μm, an Si-doped n-type Al$_{0.5}$Ga$_{0.5}$N clad layer 1003 with an impurity concentration of $5\times10^{17}$ cm$^{-3}$ and thickness of 0.3 μm, an Si-doped GaN light confinement layer 1004 with a thickness of 0.1 μm, an Si-doped In$_{0.5}$Ga$_{0.9}$N active layer 1005 with a thickness of 10 nm, an Si-doped GaN light confinement layer 1006 with a thickness of 0.1 μm, an Mg-doped p-type Al$_{0.5}$Ga$_{0.5}$N clad layer 1007 with an impurity concentration of $5\times10^{17}$ cm$^{-3}$ and thickness of 0.3 μm, and an Si-doped GaN current path narrowing layer 1008 with a thickness of 0.1 μm are sequentially formed on an n-type silicon substrate 1000 by MBE.

The structure obtained when the current path narrowing layer 1008 is formed is taken out from the growing chamber and a mask (not shown) is formed on the current path narrowing layer 1008. Part of the current path narrowing layer 1008 is etched away in a stripe form by use of the mask.

Then, the mask is removed, the structure is fed into the growing chamber, and an Mg-doped GaN contact layer 1009 with an impurity concentration of 1 to $3\times10^{18}$ cm$^{-3}$ and thickness of 0.1 μm is formed. Next, a p-side electrode 1010 and n-side electrode 1011 are formed to complete a semiconductor laser device.

Figure 12:
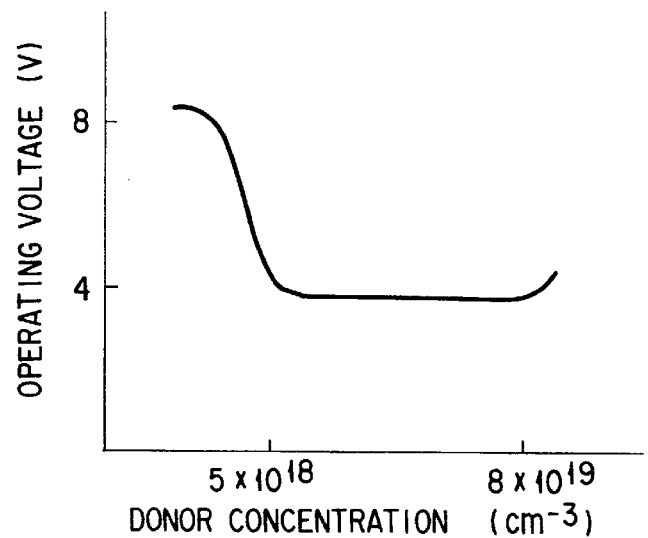
FIG. 12 is a diagram showing the relation between the operating voltage and the donor concentration of a high-impurity concentration layer in the semiconductor laser according to the fourth embodiment of this invention.
Figure 13:
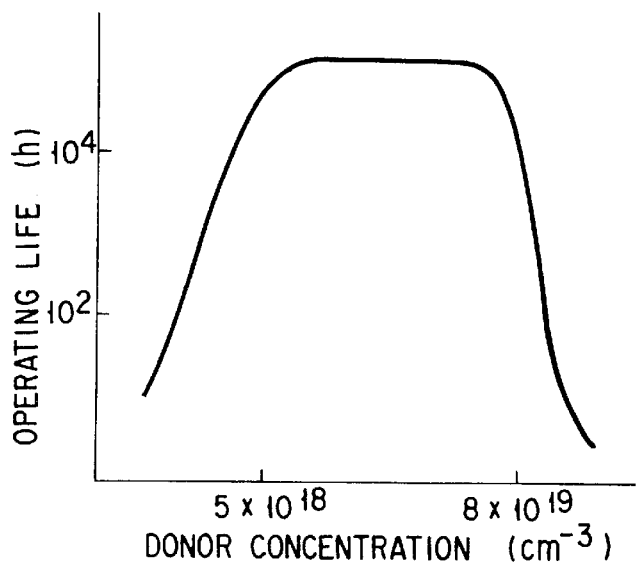
FIG. 13 is a diagram showing the relation between the operating life and the donor concentration of a high-impurity concentration layer in the semiconductor laser according to the fourth embodiment of this invention.

The semiconductor laser with the above structure was separated from the wafer by cleaving and then mounted on a copper heat sink by use of In solder with the p-side electrode 1010 used as a welding surface, and the characteristic thereof was evaluated. As the result of evaluation, it was confirmed that the continuous oscillation with the threshold current 10 mA occurred at temperatures up to 80° C. It was also confirmed that the oscillation wavelength was 375 nm, the operating voltage was 4 V, the oscillation occurred in the substrate transverse mode, and the stable operation was effected for up to 500 hours. The impurity concentration range ensuring the stable operation was from $5\times10^{18}$ cm$^{-3}$ to $8\times10^{19}$ cm$^{-3}$ as shown in FIGS. 12, 13.

With the above structure, it became possible to effect the operation at a low voltage since the thickness of the depletion layer in the hetero interface was reduced by formation of the SiC layer of high impurity concentration.

In the above embodiment, the Si substrate is used, but a C, Ge, SiGe, GeC, GeSiC substrate may be used. The buffer layer 1001 of high impurity concentration may be formed of Group-IV semiconductor, e.g. Si, Ge, and the like, in place of SiC. Further, a case where the interface between the semiconductors is used is explained, but in a case where the interface is formed between metal and semiconductor and the impurity concentration of the semiconductor side is made high, the effect of a lowering in the operating voltage can be obtained. Further, in the above embodiment, the layer structure on the substrate side with respect to the light emission layer is explained, but this invention can be applied to a layer structure (upper electrode contact structure) lying on the opposite side of the substrate with respect to the light emission layer.

In the above four embodiments, the device structure and performance of the optical semiconductor device having an n-type hetero structure are explained, but this invention is not limited to the optical semiconductor device and can be applied to a transistor such as a bipolar transistor or diode.

As described above, according to this invention, injection of carriers in the hetero interface can be made easy and the operating voltage is lowered by forming a high impurity concentration layer. As a result, a semiconductor device with high reliability can be realized.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:
    a first semiconductor layer formed of first n-type Group-III-V compound semiconductor;
    a second semiconductor layer formed on said first semiconductor layer and formed of n-type Group-II-VI compound semiconductor; and
    a third semiconductor layer formed of second Group-III-V compound semiconductor and formed between said first and said second semiconductor layer, the n-type impurity concentration thereof being set in a range of $5\times10^{18}$ cm$^{-3}$ to $5\times10^{19}$ cm$^{-3}$ which is higher than the impurity concentration of said first semiconductor layer.

2. A semiconductor device according to claim 1, wherein said third semiconductor layer is formed of at least one atom layer.

3. A semiconductor device according to claim 1, wherein said first n-type Group-III-V compound semiconductor layer is formed of one selected from a group consisting of GaAs, InP, GaP, Si, Ge, InGaP and InGaAs.

4. A semiconductor device according to claim 1, wherein said second n-type Group-III-V compound semiconductor layer contains at least one selected from a group consisting of In, Ga and P.

* * * * *